(12) United States Patent
Liu et al.

(10) Patent No.: US 11,038,130 B2
(45) Date of Patent: Jun. 15, 2021

(54) STRETCHABLE DISPLAY DEVICES

(71) Applicants: Kunshan New Flat Panel Display Technology Center Co., Ltd., Kunshan (CN); Kunshan Go-Visionox Opto-Electronics Co., Ltd., Kunshan (CN)

(72) Inventors: Huimin Liu, Kunshan (CN); Rubo Xing, Kunshan (CN); Dong Wei, Kunshan (CN); Jiantai Wang, Kunshan (CN); Xiaolong Yang, Kunshan (CN)

(73) Assignees: Kunshan New Flat Panel Display Technology Center Co., Ltd., Kunshan (CN); Kunshan Go-Visionox Opto-Electronics Co., Ltd., Kunshan (CN)

( * ) Notice: Subject to any disclaimer, the term of this patent is extended or adjusted under 35 U.S.C. 154(b) by 14 days.

(21) Appl. No.: 16/565,471

(22) Filed: Sep. 9, 2019

(65) Prior Publication Data

US 2020/0006684 A1 Jan. 2, 2020

Related U.S. Application Data

(63) Continuation of application No. PCT/CN2018/086071, filed on May 8, 2018.

(30) Foreign Application Priority Data

Mar. 14, 2018 (CN) .......................... 201810207204.0

(51) Int. Cl.
*H01L 51/00* (2006.01)
*H01L 51/52* (2006.01)
(Continued)

(52) U.S. Cl.
CPC ...... *H01L 51/0097* (2013.01); *H01L 27/3246* (2013.01); *H01L 27/3276* (2013.01); *H01L 51/5253* (2013.01); *H01L 51/56* (2013.01)

(58) Field of Classification Search
CPC ............. H01L 51/0097; H01L 51/5253; H01L 27/3246; H01L 27/3276
See application file for complete search history.

(56) References Cited

U.S. PATENT DOCUMENTS 9,907,162 B2 * 2/2018 Li ........................ G02F 1/13454
9,971,448 B2 * 5/2018 Franklin ............... G06F 3/0412
(Continued)

FOREIGN PATENT DOCUMENTS

CN 102496684 A1 6/2012
CN 105845701 A 8/2016
(Continued)

OTHER PUBLICATIONS

TW Office Action dated May 27, 2019 in the corresponding TW application (application No. 107122019).
Office Action of CN Patent Application No. 201810207204.0.

*Primary Examiner* — Ida M Soward
(74) *Attorney, Agent, or Firm* — Kilpatrick Townsend & Stockton LLP

(57) ABSTRACT

The present disclosure relates to the field of display technologies, and a stretchable display device, a method for manufacturing the same, and an electronic device are disclosed. In the present disclosure, the device includes: a stretchable substrate, a stretchable wire and a plurality of rigid islands. The stretchable wire and the plurality of rigid islands are all arranged on the stretchable substrate. The plurality of rigid islands are spaced apart on the stretchable substrate, and a pixel encapsulation body is formed on the rigid island. The stretchable wire is connected to the pixel encapsulation body to form a power supply circuit for the
(Continued)

pixel encapsulation body. The present disclosure realizes a reliable electrical connection condition, effective encapsulation and structural stability of light-emitting pixels under stretching conditions by connecting the light-emitting pixel that is separately encapsulated on each rigid island, to one another through the stretchable wire.

11 Claims, 14 Drawing Sheets

(51) Int. Cl.
*H01L 27/32* (2006.01)
*H01L 51/56* (2006.01)

(56) References Cited

U.S. PATENT DOCUMENTS

| | | | | |
|---|---|---|---|---|
| 10,064,269 | B2* | 8/2018 | Rogers | H01L 21/6835 |
| 10,355,113 | B2* | 7/2019 | Rogers | H05K 3/22 |
| 10,497,633 | B2* | 12/2019 | Rogers | H01L 23/22 |
| 10,840,536 | B2* | 11/2020 | Rogers | H01L 23/18 |
| 10,893,612 | B2* | 1/2021 | Elimelech | H05K 1/095 |
| 2012/0318318 | A1* | 12/2012 | Metin | H02S 40/34 |
| | | | | 136/244 |
| 2013/0041235 | A1* | 2/2013 | Rogers | A61B 5/1107 |
| | | | | 600/306 |
| 2013/0316487 | A1* | 11/2013 | de Graff | H01L 27/14687 |
| | | | | 438/66 |
| 2014/0039290 | A1* | 2/2014 | De Graff | H01L 27/14687 |
| | | | | 600/377 |
| 2016/0120450 | A1* | 5/2016 | Sakurai | G01J 3/0202 |
| | | | | 600/310 |
| 2016/0204185 | A1 | 7/2016 | Iijima et al. | |
| 2016/0211471 | A1* | 7/2016 | Kwon | H01L 51/5275 |
| 2016/0240802 | A1 | 8/2016 | Lee | |
| 2016/0293571 | A1 | 10/2016 | Yoon et al. | |
| 2017/0040306 | A1 | 2/2017 | Kim et al. | |
| 2017/0181276 | A1* | 6/2017 | Sawada | B32B 15/14 |
| 2018/0046221 | A1 | 2/2018 | Choi et al. | |
| 2018/0070878 | A1* | 3/2018 | Kamakura | A61B 5/6832 |
| 2019/0278422 | A1* | 9/2019 | Franklin | G06F 1/163 |
| 2019/0392786 | A1* | 12/2019 | Chida | G09G 5/006 |

FOREIGN PATENT DOCUMENTS

| | | |
|---|---|---|
| CN | 105895662 A | 8/2016 |
| CN | 107731866 A | 2/2018 |
| KR | 20170088013 A | 8/2017 |
| TW | 201322515 A | 6/2013 |
| TW | 201628185 A | 8/2016 |
| TW | 201806209 A | 2/2018 |

\* cited by examiner

STRETCHABLE DISPLAY DEVICES

CROSS-REFERENCES TO RELATED APPLICATIONS

This application is a continuation application for International Application PCT/CN2018/086071, filed on May 8, 2018, which claims the priority benefit of Chinese Patent Application No. 201810207204.0, titled "STRETCHABLE DISPLAY DEVICE, METHOD FOR MANUFACTURING THE SAME, AND ELECTRONIC DEVICE" and filed on Mar. 14, 2018. The entireties of both applications are incorporated by reference herein for all purposes.

TECHNICAL FIELD

Exemplary embodiments of the present disclosure relate to the field of display technologies, and more particularly, to a stretchable display device, a method for manufacturing the same, and an electronic device.

BACKGROUND

An organic light-emitting diode (abbreviated as OLED) display is referred as to a fantasy display, and has a bright application prospect in the field of display. Desirable as they are, OLED display are challenging to manufacture.

SUMMARY

An object of the present disclosure is to provide a stretchable display device, a method for manufacturing the same, and an electronic device, in which a separately encapsulated light-emitting pixel on each rigid island is connected to one another by a stretchable wire, thereby realizing reliable electrical connection conditions, effective encapsulation and structural stability of light-emitting pixels under stretchable conditions.

In order to solve the above technical problems, the present disclosure provides a stretchable display device, including a stretchable substrate, a stretchable wire and a plurality of rigid islands. The stretchable wire and the plurality of rigid islands are arranged on the stretchable substrate. The plurality of rigid islands are spaced apart on the stretchable substrate. A pixel encapsulation body is formed on the rigid island. The stretchable wire is connected to the pixel encapsulation body to form a power supply circuit for the pixel encapsulation body.

The present disclosure further provides a method for manufacturing a stretchable display device, including: providing a stretchable substrate; forming a plurality of rigid islands spaced apart from one another on the stretchable substrate; forming a stretchable wire on the stretchable substrate, and forming a pixel encapsulation body on the rigid island. The stretchable wire is connected to the pixel encapsulation body to form a power supply circuit for the pixel encapsulation body.

The present disclosure further provides an electronic device including the above stretchable display device.

In the embodiment of the present disclosure, the plurality of rigid islands are spaced apart on the stretchable substrate, the stretchable wire is arranged on the stretchable substrate, that is, the stretchable wire is arranged within an interval area between adjacent rigid islands, and power is supplied to the pixel encapsulation body on each rigid island through the stretchable wire, so that the light-emitting pixel is encapsulated on the rigid island separately, and the power is supplied through the stretchable wire. In such a way, the interval area between the adjacent rigid islands on the stretchable substrate becomes a stretchable area, and the stretchable wire is formed on the stretchable area. Therefore, when the stretchable substrate is stretched by an external force, the stretchable area is deformable, thereby causing the display device to have stretchability. In addition, the stretchable wire is stretchable with the stretchable substrate and provides a reliable electrical connection condition (i.e., a reliable power supply circuit) for the pixel encapsulation body on the rigid island. Meanwhile, since the pixel encapsulation body on the rigid island is separately encapsulated, and the rigid island is not stretched as the stretching of the stretchable substrate, the pixel encapsulation body on the rigid island will not be affected by the external force under the stretching condition, thereby maintaining the stability of its structure and the effectiveness of the encapsulation.

In an embodiment, the pixel encapsulation body includes a first moisture-oxygen barrier layer, a pixel unit and a second moisture-oxygen layer. The first moisture-oxygen barrier layer, the pixel unit and the second moisture-oxygen layer are formed on the rigid island sequentially. A sealed space is formed between the first moisture-oxygen barrier layer and the second moisture-oxygen layer. At least a portion of the pixel unit extends out of the sealed space, and is connected to the stretchable wire. By sequentially forming the first moisture-oxygen barrier layer, the pixel unit and the second moisture-oxygen barrier layer, the formed second moisture-oxygen barrier layer and the first moisture-oxygen barrier layer may form the sealed space in a laminating manner, and the pixel unit may be encapsulated in the sealed space, whereby not only the process is simplified, but also the encapsulation effect is good.

In an embodiment, the pixel unit includes: a first electrode layer, a light-emitting layer, and a second electrode layer. The first electrode layer is located above the first moisture-oxygen barrier layer, and at least a portion of the first electrode layer extends out of the sealed space and is connected to the stretchable wire in a first direction on the stretchable substrate. The light-emitting layer is located between the first electrode layer and the second electrode layer, and the light-emitting layer is encapsulated in the sealed space. The second electrode layer is located under the second moisture-oxygen barrier layer, and at least a portion of the second electrode layer extends out of the sealed space and is connected to the stretchable wire in a second direction on the stretchable substrate. The first direction is perpendicular to the second direction.

In an embodiment, the pixel encapsulation body further includes a pixel defining layer defining a position at which the light emitting layer is formed. The pixel defining layer is formed on the first electrode layer, and extends out of the first electrode layer in the second direction, until partially overlapping with the stretchable wire in the second direction. A central area of the pixel defining layer is a pixel defining area. A bottom of the pixel defining area penetrates to the first electrode layer to expose the first electrode layer, and the light-emitting layer is formed on a portion of the first electrode layer exposed out of the pixel defining area. The second electrode layer is formed on the light-emitting layer, and extends to the stretchable wire in the second direction.

In an embodiment, a groove surrounding the pixel defining area is formed in the pixel defining layer. A bottom of the groove penetrates to the first electrode layer in the second direction and penetrates to the first moisture-oxygen barrier layer in the first direction. Since the groove penetrates through the pixel defining layer, that is, a portion of the bottom of the groove penetrates to the first moisture-oxygen barrier layer, and another portion penetrates to the first electrode layer, after the second moisture-oxygen layer is formed, a portion of the second moisture-oxygen layer located on the surface of the groove is directly connected to the first moisture-oxygen barrier layer, and another portion is spaced from the first moisture-oxygen barrier layer only by the first electrode layer. Since the first electrode layer is very thin, the second moisture-oxygen layer is very close to the first moisture-oxygen barrier layer at the first electrode layer. Therefore, by means of the configuration of the groove, the sealed space formed by the second moisture-oxygen layer and the first moisture-oxygen barrier layer has a better sealing effect. Meanwhile, since the groove is formed in the pixel defining layer, the position of the sealed connection between the second moisture-oxygen barrier layer and the first moisture-oxygen barrier layer does not additionally occupy the surface area of the rigid island, which is advantageous to improve the effective utilization ratio of the area of the rigid island.

In an embodiment, an electrode contact hole is formed in the pixel defining layer. The electrode contact hole is configured to expose the stretchable wire in the second direction. The second electrode layer is connected to the stretchable wire in the second direction through the electrode contact hole, whereby the second electrode layer can be connected to the stretchable wire reliably.

In an embodiment, a patterned rigid layer is deposited on the stretchable substrate, and the patterned rigid layer forms the plurality of rigid islands. An elastic modulus of the rigid layer is larger than an elastic modulus of the stretchable substrate.

In an embodiment, the rigid layer is made of a material including one of polyimide, silicone rubber with high elastic modulus, and polymethyl methacrylate or a combination thereof. The processing technology of the above materials is mature or almost mature, which can better ensure the effectiveness and stability of the encapsulation structure of the pixel encapsulation body.

In an embodiment, the first moisture-oxygen barrier layer and the second moisture-oxygen layer may be formed by any one of the following processing technologies respectively: atomic layer deposition, chemical vapor deposition and physical vapor deposition. The material of each of the first moisture-oxygen barrier layer and the second moisture-oxygen barrier layer is a material having a moisture-oxygen barrier property, specifically, may be an atomic layer deposition encapsulation material, or a combination of an organic adhesive material with the following materials: silicon nitride (SiNx), and silicon oxide (SiOx), but not limited thereto.

In an embodiment, the stretchable wire may be made of a material including one of a metal material, a carbon nanomaterial, conductive polymer, and an ion conductor material or a combination thereof, thereby causing the implementation of the stretchable wire more flexible and more adoptable.

In an embodiment, the stretchable wire is formed on the stretchable substrate, and during the process of forming the pixel encapsulation body on the rigid island, the stretchable wire is formed on the stretchable substrate first, and the first moisture-oxygen barrier layer is formed on the rigid island in turn, or the first moisture-oxygen barrier layer is formed on the rigid island first, and the stretchable wire is formed on the stretchable substrate in turn. Since the processing temperature of the first moisture-oxygen barrier layer is higher than that of the stretchable wire, the first moisture-oxygen barrier layer is formed prior to forming the stretchable wire, so that it avoids the stretchable wire from being subjected to a high temperature, which is not only advantageous to simplify the process, but also makes the stretchable wire more reliable.

BRIEF DESCRIPTION OF THE DRAWINGS

One or more embodiments are exemplarily described with references to figures in accompanying drawings corresponding to the one of more embodiments. These exemplary descriptions do not constitute limitation to the embodiments. In the accompanying drawings, elements having same reference numerals represent similar elements. The figures in the accompanying drawings do not constitute proportional limitation, unless otherwise specified.

FIG. 4b is a structural schematic diagram illustrating a cross section taken along a dashed line in FIG. 4a.

FIG. 5b is a structural schematic diagram illustrating a cross section taken along a dashed line in FIG. 5a.

FIG. 6b is a structural schematic diagram illustrating a cross section taken along a dashed line in FIG. 6a.

FIG. 7b is a structural schematic diagram illustrating a cross section taken along a dashed line in FIG. 7a.

FIG. 8b is a structural schematic diagram illustrating a cross section taken along a dashed line in FIG. 8a.

DETAILED DESCRIPTION OF THE INVENTION

Figure 1:
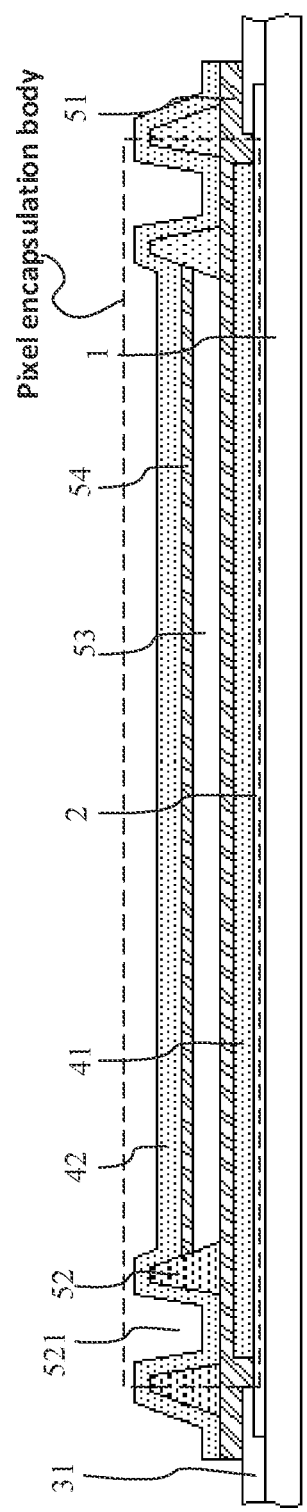
FIG. 1 is a structural schematic diagram illustrating a cross section of a stretchable display device according to a first embodiment of the present disclosure.

As explained above, OLED devices are challenging to manufacture. An organic layer in the OLED device is very sensitive to moisture and oxygen. The moisture and oxygen permeating from the outside is the main factor causing the performance degradation and the lifetime reduction of the OLED device. Therefore, the encapsulation technology is very important for the OLED display. As the display technology of organic light-emitting diodes has matured successively, it has been more and more desired that organic light-emitting display devices have stretchability; that is, they are able to extend or shrink and bend, when being stretched.

The pixels of a conventional organic light-emitting display device are generally encapsulated as a whole, so the requirements of the stretchable display cannot be satisfied. The current organic light-emitting display device cannot ensure stability of the structure of the light-emitting pixel while satisfying the stretchable display performance.

In order to make the objectives, technical solutions and advantages of the present disclosure more comprehensible, some of embodiments of the present disclosure will be described in detail with reference to the accompanying drawings. However, it will be apparent to those skilled in the art that in some embodiments of the present disclosure, various technical details are described in order to make the present disclosure easier to be understood. However, the technical solutions sought to be protected by the claims of this application may be implemented even without the technical details and various changes and modifications made to the following embodiments.

First Embodiment

The first embodiment of the present disclosure relates to a stretchable display device. This device includes a stretchable substrate 1, a stretchable wire 3 and a plurality of rigid islands 2. The stretchable wire 3 and the plurality of rigid islands 2 are arranged on the stretchable substrate 1. The plurality of rigid islands 2 are spaced apart on the stretchable substrate 1. A pixel encapsulation body is formed on the rigid island 2. The stretchable wire 3 is connected to the pixel encapsulation body to form a power supply circuit for the pixel encapsulation body. The plurality of rigid islands 2 are spaced apart on the stretchable substrate 1, and the stretchable wire 3 is arranged on the stretchable substrate 1, that is, the stretchable wire 3 is arranged within an interval area between adjacent rigid islands 2, and power is supplied to the pixel encapsulation body on each rigid island 2 through the stretchable wire 3, so that the light-emitting pixel is encapsulated on the rigid island 2 separately, and the power is supplied through the stretchable wire 3. In such a way, the interval area between the adjacent rigid islands 2 on the stretchable substrate 1 becomes a stretchable area, and the stretchable wire 3 is formed on the stretchable area. Therefore, when the stretchable substrate 1 is stretched by an external force, the stretchable area is deformable, thereby causing the display device to have stretchability. In addition, the stretchable wire 3 is stretchable with the stretchable substrate 1 and provides a reliable electrical connection condition (i.e., a reliable power supply circuit) for the pixel encapsulation body on the rigid island 2. Meanwhile, since the pixel encapsulation body on the rigid island 2 is separately encapsulated, and the rigid island 2 is not stretched as the stretching of the stretchable substrate 1, the pixel encapsulation body on the rigid island 2 will not be affected by the external force under the stretching condition, thereby maintaining the stability of its structure and the effectiveness of the encapsulation. Details of the implementation of the stretchable display device according to this embodiment will be described in detail below. The details described below are merely for facilitating understanding of the implementation. The details of the implementation of this embodiment may be not essential for implementing the solution.

Referring to the structural schematic diagram of a cross section of the stretchable display device shown in FIG. 1, FIG. 1 only shows a cross-sectional structure of one rigid island 2 on the stretchable substrate 1 and a pixel encapsulation body on the rigid island 2. The structural features and the forming method of the stretchable display device according to this embodiment will be described in detail below with reference to FIGS. 2 to 9. In order to describe the pixel encapsulation structure on the rigid island 2 clearly, in the top views of the rigid island 2 and the pixel encapsulation structure thereon shown in FIGS. 4a to 8a and 9, the stretchable substrate is omitted, while the stretchable substrate 1 is retained in the corresponding cross-sectional views.

Figure 2A:
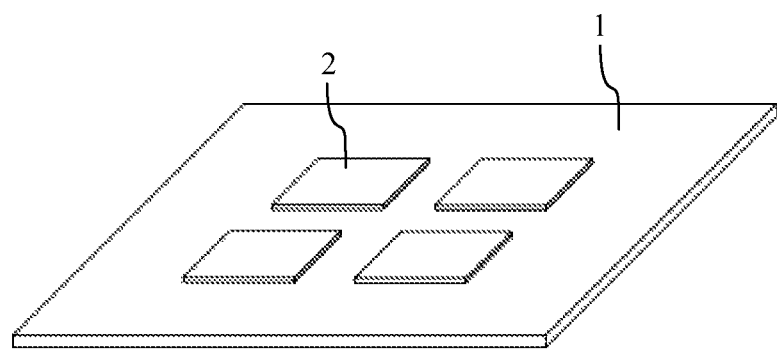
FIG. 2a is a structural schematic diagram illustrating a plurality of rigid islands spaced apart from one another in the stretchable display device according to the first embodiment of the present disclosure.
Figure 2B:
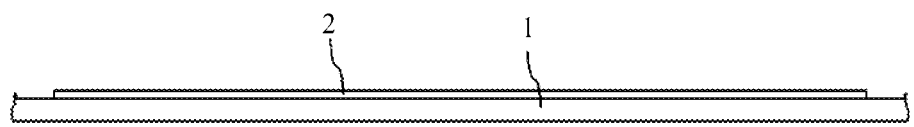
FIG. 2b is a structural schematic diagram illustrating a cross section of a rigid island in FIG. 2a, taken along a lateral direction.

Referring to FIG. 2a, it shows that the plurality of rigid islands 2 are spaced apart on the stretchable substrate 1. The stretchable substrate 1 is made of an elastic material. Specifically, the stretchable substrate 1 may be made of an elastic material such as polydimethylsiloxane (abbreviated as PDMS) with low modulus, elastic polyimide, polyurethane or the like. The material of the stretchable substrate 1 is not particularly limited to this embodiment, as long as it can satisfy the stretchability required for the design. In this embodiment, a patterned rigid layer is deposited on the stretchable substrate 1. The patterned rigid layer forms the plurality of rigid islands 2, that is, the plurality of rigid islands 2 spaced apart on the stretched substrate 1 may be obtained by forming a rigid layer deposited on the stretchable substrate 1 and patterning the rigid layer. The elastic modulus of the rigid layer is greater than the elastic modulus of the stretchable substrate 1, that is, the elastic modulus of the rigid layer is higher than that of the stretchable substrate. In practical applications, the material of the rigid layer may include any one of polyimide PI, silicone rubber with high elastic modulus, and polymethyl methacrylate (abbreviated as PMMA) or a combination thereof. The silicone rubber with high elastic modulus is, for example, a PDMS having high elastic modulus, and the embodiment does not specifically limit the material of the rigid layer. The processing technologies of the above materials are mature or almost mature, which can better ensure the effectiveness and stability of the encapsulation structure of the pixel encapsulation body. The rigid island structure may be formed on the stretchable substrate after patterning the rigid layer. For the purpose of simplicity, only one rigid island 2 is shown in FIG. 2b.

In this embodiment, the processing method of the rigid island 2 is not specifically limited, as long as the required plurality of rigid islands 2 can be formed. In general, the plurality of rigid islands 2 on the stretchable substrate 1 may be arranged in a matrix structure. The larger the interval between adjacent rigid islands 2, the larger the stretchable area on the stretchable substrate 1 is, so that the deformability of the stretchable substrate 1 is stronger when the stretchable substrate is stretched. However, the increase in the interval may result the decrease in the aperture ratio of the display device. Therefore, in practical applications, the interval between adjacent rigid islands 2 may be designed according to the required stretchability and aperture ratio. The size of the interval between rigid islands 2 is not specifically limited in this embodiment. Furthermore, the shape of the rigid island 2 may be a rectangle. The shape of the rigid island 2 is not specifically limited in this embodiment, as long as the shape is suitable to act as a rigid protective layer for the pixel encapsulation body. Since the elastic modulus of the rigid island 2 is larger than the elastic modulus of the stretchable substrate 1, when the stretchable substrate 1 is being stretched, the rigid island 2 is substantially not deformed, so that it can protect the pixel encapsulation body thereon, that is, it is possible to prevent the encapsulation structure of the pixel encapsulation body and the light-emitting pixel (i.e. the pixel unit) in the encapsulation structure from being damaged when the stretchable substrate 1 is being stretched.

Figure 3A:
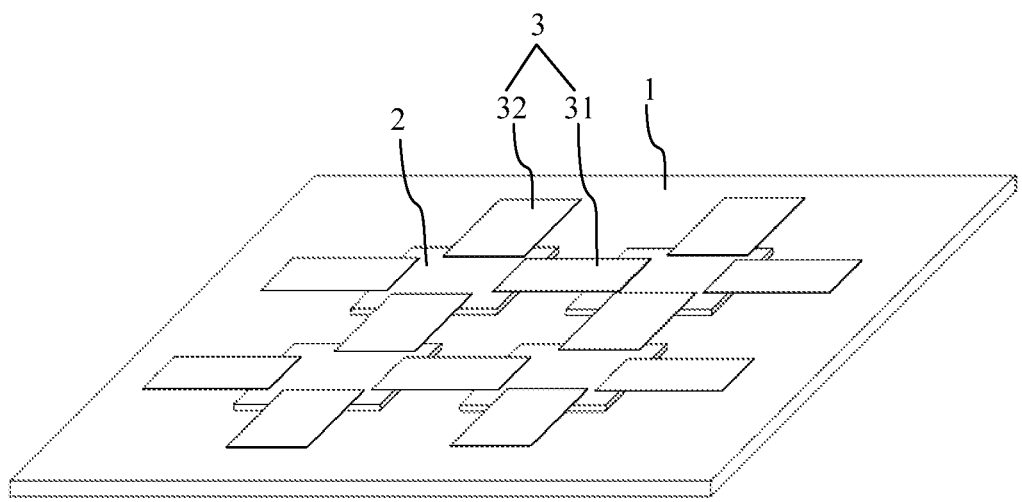
FIG. 3a is a structural schematic diagram illustrating a stretchable wire of the stretchable display device according to the first embodiment of the present disclosure.
Figure 3B:
FIG. 3b is a structural schematic diagram illustrating a cross section of a rigid island in FIG. 3a, taken along the lateral direction.

Referring to FIG. 3a and FIG. 3b, in this embodiment, the stretchable wire 3 is arranged on the stretchable substrate 1. The stretchable wire 3 is connected to the pixel encapsulation body to form the power supply circuit for the pixel encapsulation body. Specifically, the stretchable wire 3 is arranged in the interval area between adjacent rigid islands 2 (i.e., the stretchable area on the stretched substrate), and extends onto the rigid island 2. The stretchable wire 3 specifically includes a plurality of row wires 31 arranged on the stretchable substrate 1 in a first direction, and a plurality of column wires 32 arranged on the stretchable substrate in a second direction. The row wire 31 and the column wire 32 are perpendicular to each other, that is, the first direction and the second direction are perpendicular to each other. The row wire 31 and the column wire 32 are both stretchable wires. The row wire 31 is configured to be connected to an anode or cathode of the light-emitting pixel encapsulated in the pixel encapsulation body on the rigid island 2, and the column wire 32 is configured to be connected to the cathode or anode of the light-emitting pixel, so that power is supplied to the light-emitting pixel. Therefore, the number of the row wires 31 is equal to the number of the column wires 32 on the stretchable substrate 1. In order to reliably connect the stretchable wire 3 to the pixel encapsulation body, at least a portion of the stretchable wire 3 extends to the rigid island 2. Specifically, at least a portion of the row wire 31 extends onto both left and right ends of the rigid islands 2, and at least a portion of the column wire 32 extends onto both upper and lower ends of the rigid islands 2. In this embodiment, the size, area and the like of the portion of the row wire 31 and the column wire 32 located on the rigid island 2 are not particularly limited, as long as the reliable connection between the stretchable wire 3 and the pixel encapsulation body can be satisfied. Each of the row wires 31 and the column wires 32 is connected to an external control chip, and is powered on or off under the control of the external chip. When the row wire 31 and the column wire 32 connected to the cathode and the anode of the light-emitting pixel in the pixel encapsulation body respectively are powered on, the light-emitting pixel may emit light, otherwise, the light-emitting pixel does not emit light, thereby achieving the separate control of each light-emitting pixel.

In this embodiment, the stretchable wire 3 may be made of a material including any one of a metal material, a carbon nanomaterial, a conductive polymer, and an ion conductor material or a combination thereof. The stretchable wire is, for example, a metal wire, which is for example made of a metal having better conductivity such as gold, silver, copper, aluminum, molybdenum, chromium or the like, or made of an alloy metal having conductivity satisfying design requirements. In an example, the stretchable wire 3 may also be made of a metal nanomaterial. For example, the stretchable wire 3 may be processed by using a metal nanowire, nanoparticles, a nanosheet, a nanobelt or the like. The stretchable wire 3 may also be made of a carbon nanomaterial, such as graphene, multilayer graphite, a carbon nanotube, a carbon nanobelt or the like. A liquid metal material may also be used to process the stretchable wire 3, for example, using a gallium-containing alloy to make the stretchable wire 3. Alternatively, the stretchable wire 3 may also be processed by using conductive polymer, an ion conductor material or the like. In this embodiment, the processing material of the stretchable wire 3 is not particularly limited, as long as the stretchable wire 3 made of the material can satisfy the stretchability and conductivity requirement. The stretchable wire 3 may be obtained by a patterning process, for example, the stretchable wire 3 may be made by printing, photolithography, laser etching or other patterning processes. The patterning process of the above-mentioned stretchable wire 3 is well known to those skilled in the art, and will not be detailed here. In general, the stretchable wire 3 may maintain conductivity constant or with a minor change in the case of deformation caused by being stretched. Even if the stretchable wire 3 has a certain conductivity change, it may also be compensated by an external circuit, thereby realizing that the displaying brightness of the display device does not change significantly during stretching.

In this embodiment, the pixel encapsulation body is formed on each rigid island 2, and the pixel encapsulation body is connected to the stretchable wire 3, thereby implementing power supply for the pixel encapsulation body. Referring again to FIG. 1, the pixel encapsulation body includes a first moisture-oxygen barrier layer 41, a pixel unit and a second moisture-oxygen barrier layer 42. The first moisture-oxygen barrier layer 41, the pixel unit and the second moisture-oxygen layer 42 are formed on the rigid island 2 sequentially. A sealed space is formed between the first moisture-oxygen barrier layer 41 and the second moisture-oxygen layer 42. At least a portion of the pixel unit extends out of the sealed space, and is connected to the stretchable wire. Specifically, the pixel unit includes a first electrode layer 51, a pixel defining layer 52 configured to define a position at which the light-emitting layer is formed, a light-emitting layer 53 and a second electrode layer 54.

The first electrode layer 51 is located above the first moisture-oxygen barrier layer 41, and at least a portion of the first electrode layer 51 extends out of the sealed space and is connected to the stretchable wire in the first direction (i.e., the row wire 31) on the stretchable substrate 1. The pixel defining layer 52 is formed on the first electrode layer 51 and extends out of the first electrode layer 51 in the second direction, until partially overlapping with the stretchable wire in the second direction (i.e., the column wire 32). A central area of the pixel defining layer 52 is a pixel defining area. The bottom of the pixel defining area penetrates to the first electrode layer 51 to expose the first electrode layer 51. The light-emitting layer 53 is located between the first electrode layer 51 and the second electrode layer 54, and the light-emitting layer 53 is encapsulated in the sealed space. The second electrode layer 54 is located under the second moisture-oxygen barrier layer 42, and at least a portion of the second electrode layer 54 extends out of the sealed space and is connected to the stretchable wire in the second direction (i.e., the column wire 32) on the stretchable substrate. Specifically, the light-emitting layer 53 is formed on the first electrode layer 51 exposed in the pixel defining area. The second electrode layer 54 is formed on the light-emitting layer 53 and extends to the stretchable wire in the second direction. In this embodiment, a groove 521 surrounding the pixel defining area is formed in the pixel defining layer 52. The bottom of the groove 521 penetrates to the first electrode layer 51 in the second direction, and penetrates to the first moisture-oxygen barrier layer 41 in the first direction. An electrode contact hole 522 (referring to FIG. 6*a*) is formed in the pixel defining layer 52. The electrode contact hole 522 is configured to expose the stretchable wire in the second direction (i.e., the column wire 32). The second electrode layer is connected to the stretchable wire in the second direction through the electrode contact hole 522.

The structure of the pixel encapsulation body will be described in detail below in connection with a method for forming the pixel encapsulation body.

Figure 4A:
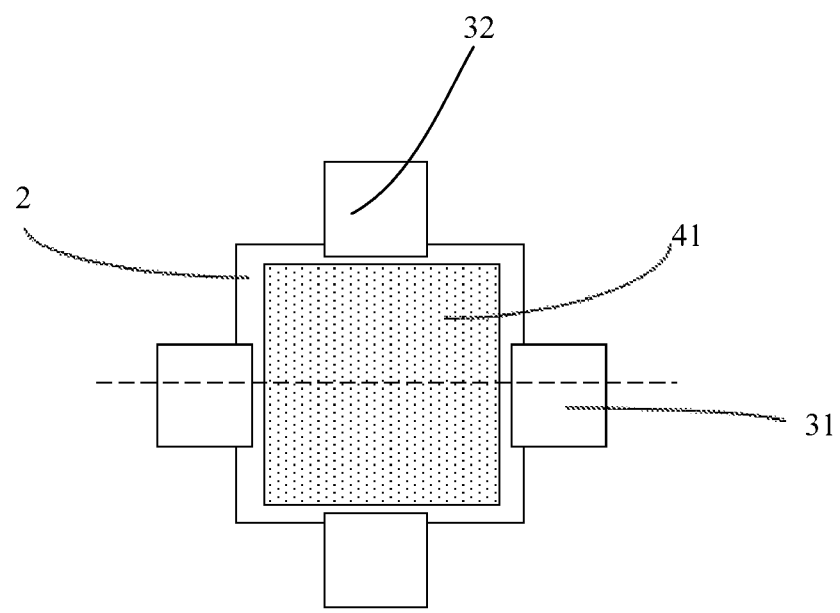
FIG. 4a is a top view of a rigid island having a first moisture-oxygen barrier layer in the stretchable display device according to the first embodiment of the present disclosure.
Figure 4B:
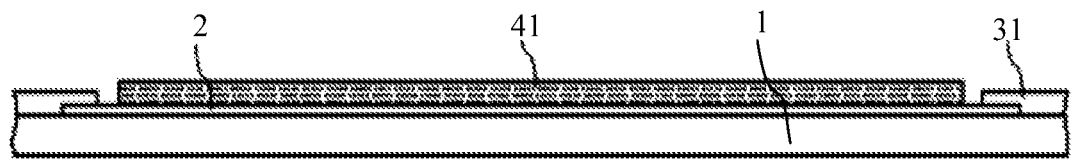

Referring to FIG. 4*a* and FIG. 4*b*, in order to facilitate the implementation of the structure of the pixel encapsulation body described above, the first moisture-oxygen barrier layer 41 is formed first on each rigid island 2. Specifically, the first moisture-oxygen barrier layer 41 may be obtained by using a chemical vapor deposition (abbreviated as CVD) process. In practical applications, the first moisture-oxygen barrier layer 41 may also be formed by an atomic layer deposition (abbreviated as ALD) process. The thickness of the first moisture-oxygen barrier layer 41 formed by the atomic layer deposition process is very thin. In some examples, the first moisture-oxygen barrier layer 41 may also be obtained by a physical vapor deposition (abbreviated as PVD) process. The ALD, CVD, and PVD processes are well known to those skilled in the art, and will not be detailed here. The first moisture-oxygen barrier layer 41 is made of a material having a moisture-oxygen barrier property, specifically, an atomic layer deposition encapsulation material, or a combination of an organic adhesive material with the following materials: silicon nitride (SiNx), and silicon oxide (SiOx), but not limited thereto. In this embodiment, the material and processing technology of the first moisture-oxygen barrier layer are not specifically limited, as long as the moisture-oxygen barrier effect required for the design can be achieved. It should be noted that since the processing temperature of the first moisture-oxygen barrier layer 41 is higher than the processing temperature of the stretchable wire, in practical applications, the first moisture-oxygen barrier layer 41 may be formed first, and then the stretchable wire may be formed, thereby protecting the stretchable wire. When the stretchable wire is formed first, and the first moisture-oxygen barrier layer 41 is formed in turn, the first moisture-oxygen barrier layer 41 may cover the area of each rigid island 2 as much as possible excepting the stretchable wire. When the first moisture-oxygen barrier layer 41 is formed first, and the stretchable wire is formed in turn, the first moisture-oxygen barrier layer 41 may cover the area of the whole rigid island 2 as much as possible. A portion of the stretchable wire may be formed on the first moisture-oxygen barrier layer 41 so as to be connected to the light-emitting pixel in the pixel encapsulation body. These will not be specifically limited to this embodiment.

Figure 5A:
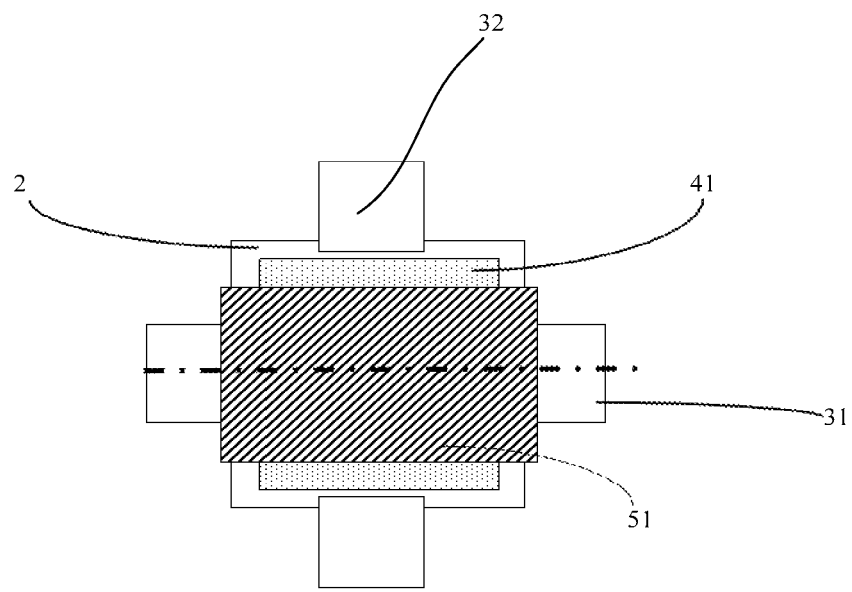
FIG. 5a is a top view of a rigid island having a first moisture-oxygen barrier layer and a first electrode layer in the stretchable display device according to the first embodiment of the present disclosure.
Figure 5B:
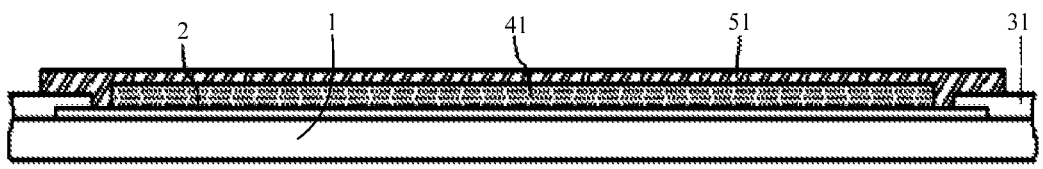

Referring to FIG. 5*a* and FIG. 5*b*, after forming the first moisture-oxygen barrier layer 41, the first electrode layer 51 is formed on the first moisture-oxygen barrier layer 41. The first electrode layer 51 may be formed by evaporation, which will not be detailed here. The first electrode layer 51 may be made of a material such as aluminum, silver or the like. In this embodiment, the extending direction of the first electrode layer 51 is parallel to the first direction, and the first electrode layer 51 is connected to the stretchable wire in the first direction (i.e., the row wire 31) on the rigid island 2. Specifically, the first electrode layer 51 may be connected to the row wire 31 by partially covering the row wire 31 located on the rigid island 2. In practical applications, the contact of the first electrode layer 51 with the row wire 31 may not only be a simple lamination contact, but also a structure similar to a hole or a groove, or by a dispensing process, causing a contact point of connection between the first electrode layer 51 and the row wire 31 on the rigid island 2 is more stable. In this embodiment, the manner of connection between the first electrode layer 51 and the row wire 31 on the rigid island 2 is not specifically limited.

Figure 6A:
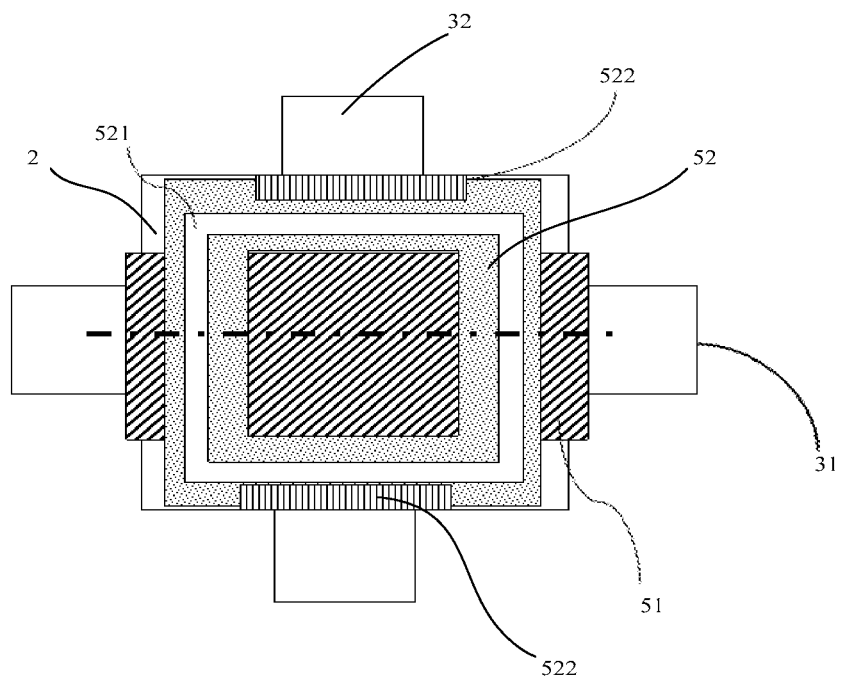
FIG. 6a is a top view of a rigid island having a first moisture-oxygen barrier layer, a first electrode layer and a pixel defining layer in the stretchable display device according to the first embodiment of the present disclosure.
Figure 6B:
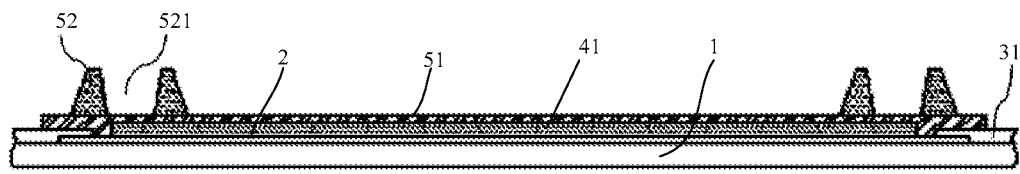

Referring to FIG. 6*a* and FIG. 6*b*, after forming the first electrode layer 51, the pixel defining layer 52 is formed on the first electrode layer 51, and the pixel defining layer 52 extends out of the first electrode layer 51 in the second direction (i.e., the column direction), until partially overlapping with the stretchable wire in the second direction. The central area of the pixel defining layer 52 is the pixel defining area. The bottom of the pixel defining area penetrates to the first electrode layer 51 to expose the first electrode layer 51. In respect with a vapor deposition process forming the light-emitting layer, the pixel defining layer 52 may support a fine mask used for vapor deposition, and in respect with an inkjet printing forming the light-emitting layer, the pixel defining layer 52 may prevent fluid from overflowing the pixel defining area. The pixel defining layer 52 may be obtained by using an organic photoresist material. The material and the processing technology of the pixel defining layer are not specifically limited in this embodiment.

It should be noted that, in this embodiment, when or after forming the pixel defining layer 52, the groove 521 surrounding the pixel defining area is further formed in the pixel defining layer 52, and the groove 521 penetrates through the pixel defining layer 52, that is, the bottom of the groove 521 penetrates to the first electrode layer 51 in the second direction, and penetrates to the first moisture-oxygen barrier layer 41 in the first direction. Since the thickness of the first electrode layer 51 is very thin, after forming the second moisture-oxygen barrier layer 42 (referring to the description below), the second moisture-oxygen barrier layer 42 in the groove 521 is very close to the first moisture-oxygen barrier layer 41, so as to realize a good seal for the light-emitting pixel in the pixel unit. For the reliable connection between the second electrode layer 54 and the stretchable wire in the second direction, when or after forming the pixel defining layer 52, an electrode contact hole 522 is further formed on the pixel defining layer 52. The electrode contact hole 522 is configured to expose at least a portion of the stretchable wire in the second direction on the rigid island 2.

Figure 7A:
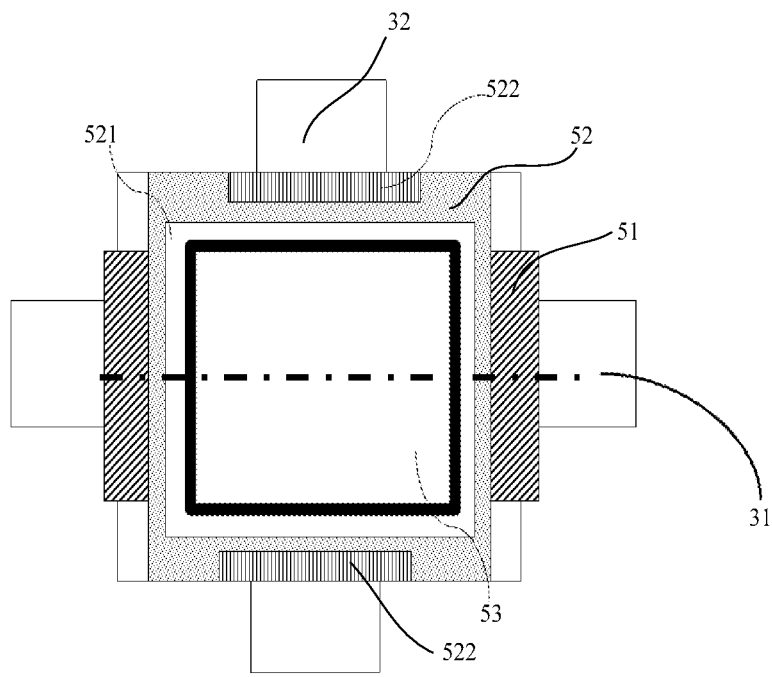
FIG. 7a is a top view of a rigid island having a first moisture-oxygen barrier layer, a first electrode layer, a pixel defining layer and a light-emitting layer in the stretchable display device according to the first embodiment of the present disclosure.
Figure 7B:
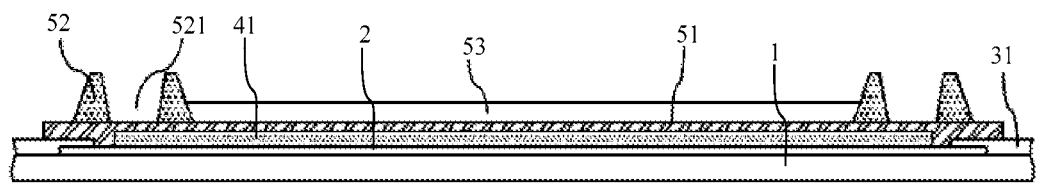

Referring to FIG. 7a and FIG. 7b, after forming the pixel defining layer 52, the light-emitting layer 53 is formed in the pixel defining area, that is, on the first electrode layer 51 exposed out of the pixel defining area. The light-emitting layer 53 refers to all functioning layers except the cathode and the anode in the light-emitting pixel. In practical applications, the light-emitting layer 53 may be formed by an evaporation method, an inkjet printing method, or a deposition method with a metal mask. The implementation of the light-emitting layer is not specifically limited in this embodiment. In this embodiment, the light-emitting layer is, for example, an OLED light-emitting layer. The structure of the OLED light-emitting layer is well known to those skilled in the art, which is not detailed here. In some examples, the light-emitting layer may be a polymeric light emitting diode (abbreviated as PLED) light-emitting layer or a quantum dot light emitting diode (abbreviated as QLED) light-emitting layer. In this embodiment, the specific structure of the light-emitting layer is not limited, as long as the cathode and the anode of the light-emitting layer are not in the same plane, and the structure of the light-emitting layer prevents the moisture and oxygen intrusion.

Figure 8A:
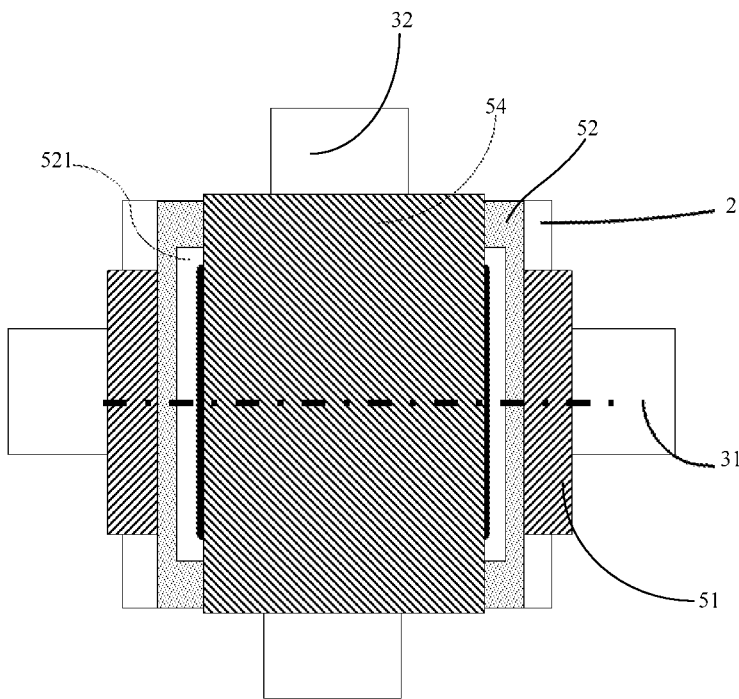
FIG. 8a is a top view of a rigid island having a first moisture-oxygen barrier layer, a first electrode layer, a pixel defining layer, a light-emitting layer and a second electrode layer in the stretchable display device according to the first embodiment of the present disclosure.
Figure 8B:
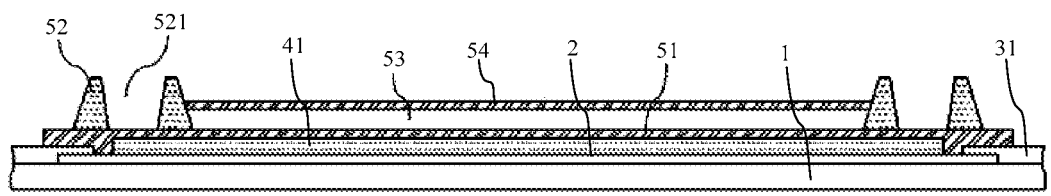

Referring to FIG. 8a and FIG. 8b, after forming the light-emitting layer 53, the second electrode layer 54 is formed on the light-emitting layer 53, and the second electrode layer 54 extends out of the sealed space and is connected to the stretchable wire 3 in the second direction on the stretchable substrate 1. Specifically, the second electrode layer 54 is connected to the stretchable wire 3 in the second direction (i.e., the column wire 32) on the rigid island 2 through the electrode contact hole 522. The processing technology of the second electrode layer 54 may be the same as that of the first electrode layer 51, which is not specifically limited in this embodiment.

It should be noted that, since the groove 521 is formed in the pixel defining layer 52, and the groove 521 penetrates through the pixel defining layer 52, in order to prevent the second electrode layer 54 from overlapping with the first electrode layer 51 through the groove 521, the widths and the forming positions of the first electrode layer 51 and the second electrode layer 54 should satisfy that the area where the both overlap with each other should be located only within the pixel defining layer. The width of the first electrode layer 51 refers to a size of an edge of the first electrode layer 51 parallel to the second direction, and the width of the second electrode layer 54 refers to a size of an edge of the second electrode layer 54 parallel to the first direction. This embodiment does not specifically limit the widths of the first electrode layer 51 and the second electrode layer 54.

Figure 9:
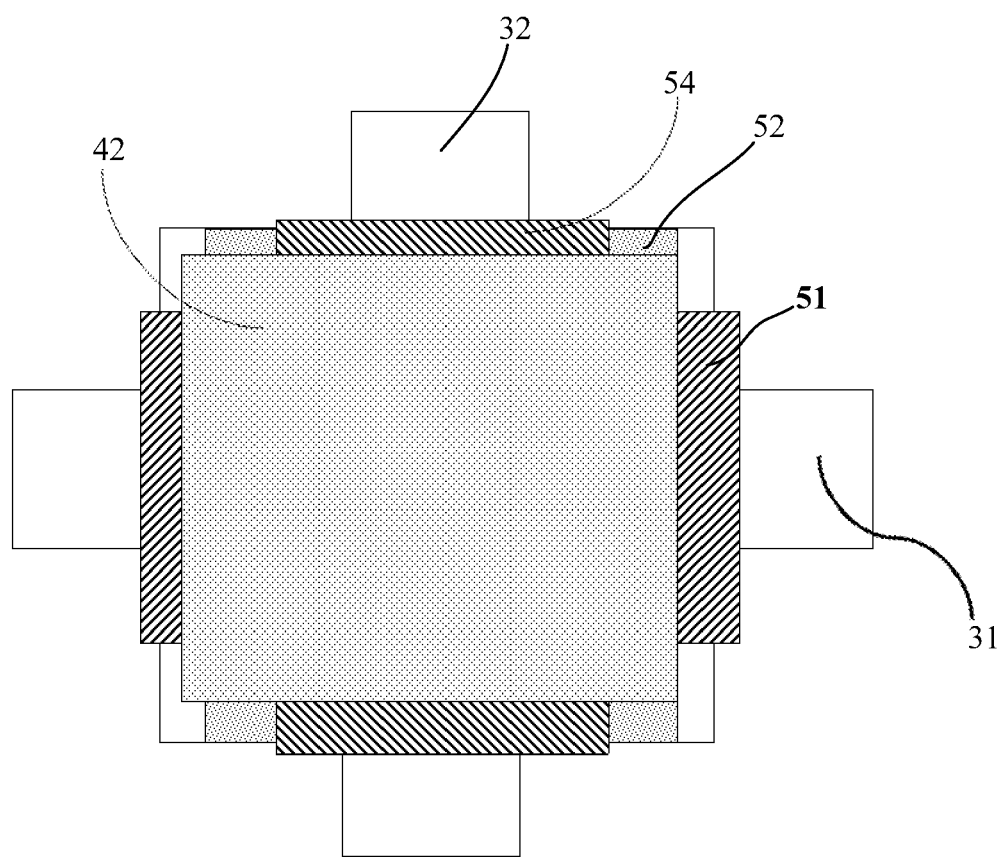
FIG. 9 is a top view of a rigid island having a first moisture-oxygen barrier layer, a first electrode layer, a pixel defining layer, a light-emitting layer, a second electrode layer and a second moisture-oxygen barrier layer in the stretchable display device according to the first embodiment of the present disclosure.

Referring to FIG. 1 and FIG. 9, after forming the second electrode layer 54, the second moisture-oxygen barrier layer 42 is deposited on a side of each rigid island 2 away from the stretchable substrate 1. The second moisture-oxygen barrier layer 42 may be obtained by the same material and processing as those of the first moisture-oxygen barrier layer 41, which are not specifically limited in this embodiment. The second moisture-oxygen barrier layer 42 is deposited at least on a surface of the rigid island 2 surrounded by the groove 521 of the pixel defining layer 52, thereby the second moisture-oxygen barrier layer 42 forms the sealed space with the first moisture-oxygen barrier layer 41 through the groove 521. It should be noted that in order to make the sealing effect of the sealed space better, the second moisture-oxygen barrier layer 42 should cover the entire surface of the rigid island 2 as much as possible. For example, a portion of the second moisture-oxygen layer 42 may also be deposited and formed on an area of the rigid island 2 other than the pixel defining layer 52, thereby causing the second moisture-oxygen layer 42 to be connected to the first moisture-oxygen barrier layer 41 as much as possible. For example, the second moisture-oxygen layer 42 is connected to at least a portion of the first moisture-oxygen barrier layer 41 through the groove 521 to form a sealed structure, while a portion of the second moisture-oxygen layer 42 located outside the pixel defining layer 52 is connected to the first moisture-oxygen barrier layer 41 to form a further sealed structure, so that the light-emitting layer 53 may be better sealed.

It should be noted that the pixel unit in this embodiment may include one light-emitting sub-pixel, or may also include a plurality of light-emitting sub-pixels. When the pixel unit includes only one light-emitting sub-pixel, this light-emitting sub-pixel may be any one of a red sub-pixel, a green sub-pixel, a blue sub-pixel, and a white sub-pixel. Meantime, the number of each of the first electrode layer 51, the second electrode layer 54 and the light-emitting layer 53 in the pixel unit is one, and only one set of stretchable wires 3 (i.e., the row wire and the column wire) connected to the rigid island 2 where the pixel unit is located is required. When the pixel unit includes the plurality of light-emitting sub-pixels, for example, the pixel unit includes three light-emitting sub-pixels, for example, a red sub-pixel, a green sub-pixel, and a blue sub-pixel. In this case, the number of the sets of the stretchable wires 3 connected to the rigid island 2 where the pixel unit is located should be three, and each set of stretchable wires 3 is connected to one corresponding light-emitting sub-pixel. Furthermore, the pixel defining layer 52 on the rigid island 2 should define one sub-pixel defining area for each of the three light-emitting sub-pixels. Of course, the pixel unit on one rigid island 2 may further include more light-emitting sub-pixels. The specific structure of the pixel unit is not limited in this embodiment.

Figure 10:
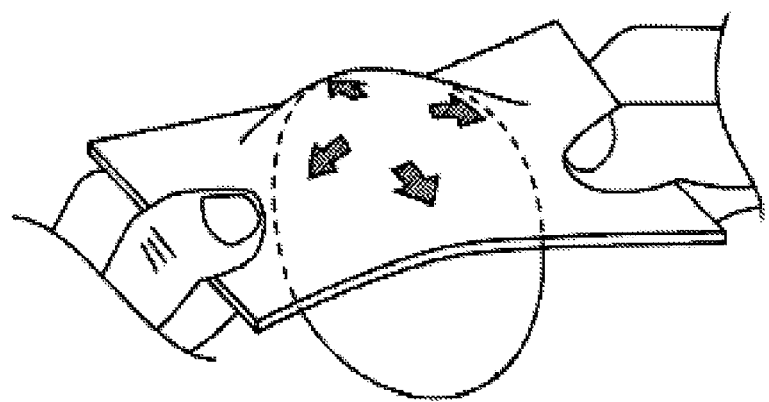
FIG. 10 is a schematic diagram illustrating stretchability of the stretchable display device according to the first embodiment of the present disclosure.

The light-emitting pixel inside the stretchable display device in the embodiment has an effective and stable encapsulation structure under stretching conditions, while the stretchability can meet the requirements of the future display formation, that is, can satisfy the 3D conformal display. In other words, the display screen may be deformed correspondingly according to the shape of the object, that is, the display screen has multi-directional stretchability similar to natural rubber, including curling (but not limited to curling), and further includes a single-axis stretching display screen (retractable) and a dual-axis stretching display screen (spherical surface, referring to FIG. 10).

In the embodiment of the present disclosure, the plurality of rigid islands 2 are spaced apart on the stretchable substrate 1, the stretchable wire 3 is arranged on the stretchable substrate 1, that is, the stretchable wire 3 is arranged within the interval area between adjacent rigid islands 2, and power is supplied to the pixel encapsulation body on each rigid island 2 through the stretchable wire 3, so that the light-emitting pixel is encapsulated on the rigid island 2 separately, and the power is supplied through the stretchable wire 3. The pixel encapsulation body is a separate encapsulation structure of the light-emitting pixel. In this embodiment, the first moisture-oxygen barrier layer 41, the pixel unit and the second moisture-oxygen barrier layer 42 are formed on the rigid island 2 sequentially, and the second moisture-oxygen barrier layer 42 formed subsequently is connected to the first moisture-oxygen barrier layer 41 formed previously through the groove 521 on the pixel defining layer in the pixel unit, thereby forming the sealed space with a good sealing effect, which realizes the effective encapsulation for the pixel unit on the rigid island 2. Meanwhile, when the stretchable wire 3 is stretched and deformed with the stretchable substrate 1, the electrical conductivity is substantially unchanged or with a minor change, thereby ensuring that the displaying brightness of the display device under stretching conditions is substantially unchanged, and the rigid island 2 will not be stretched with the stretching of the stretchable substrate 1, thereby ensuring the stability of the pixel encapsulation body.

Second Embodiment

The second embodiment of the present disclosure relates to a stretchable display device. The second embodiment is substantially the same as the first embodiment. The main difference is as below. In the first Embodiment, the groove surrounding the pixel defining area and penetrating through the pixel defining layer is formed in the pixel defining layer 52, and the second moisture-oxygen barrier layer 42 is deposited at least on the surface of the groove and the surface of the rigid island surrounded by the groove, thereby forming the sealed space enclosing the light-emitting layer with the first moisture-oxygen barrier layer 41 through the groove 521. However, in the second embodiment of the present disclosure, no groove 521 is formed in the pixel defining layer 52, and the second moisture-oxygen barrier layer 42 forms the sealed space with the first moisture-oxygen barrier layer 41 by completely covering and exceeding the entire pixel defining layer 52, thereby encapsulating the light-emitting layer in the sealed space. This embodiment enriches the implementation realizing the effective encapsulation for the pixel encapsulation body.

Figure 11:
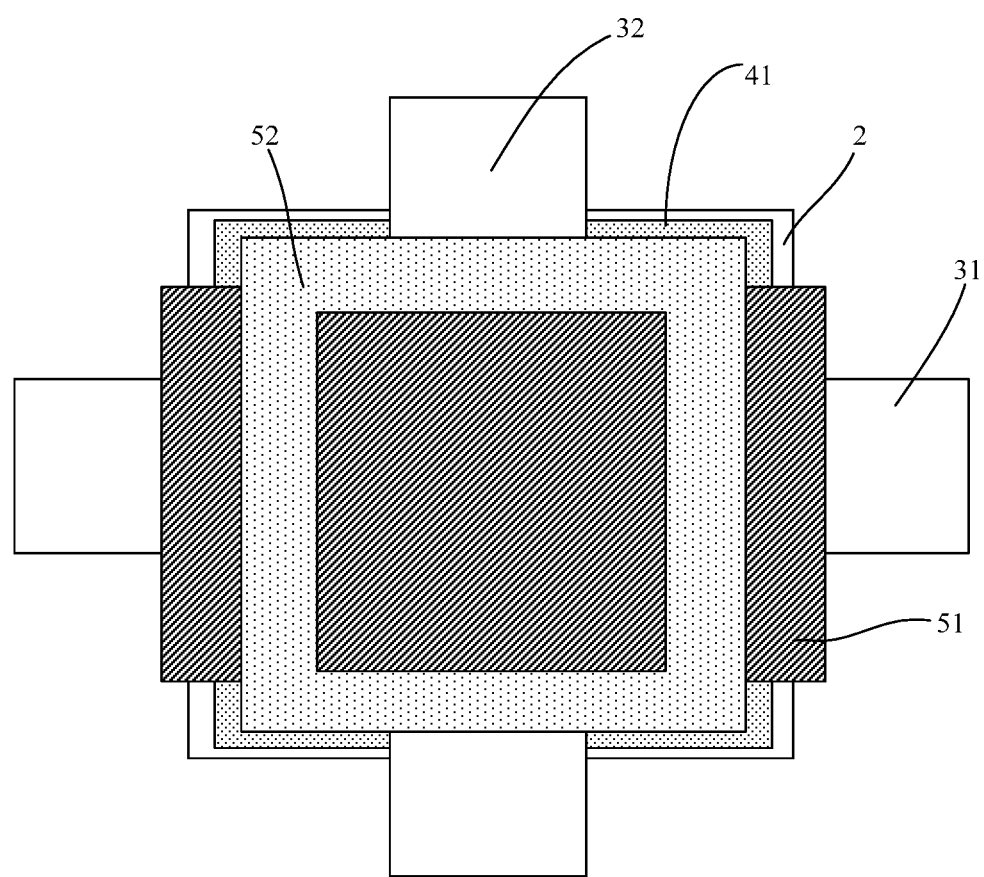
FIG. 11 is a top view of a rigid island having a first moisture-oxygen barrier layer, a first electrode layer and a pixel defining layer in a stretchable display device according to a second embodiment of the present disclosure.
Figure 12:
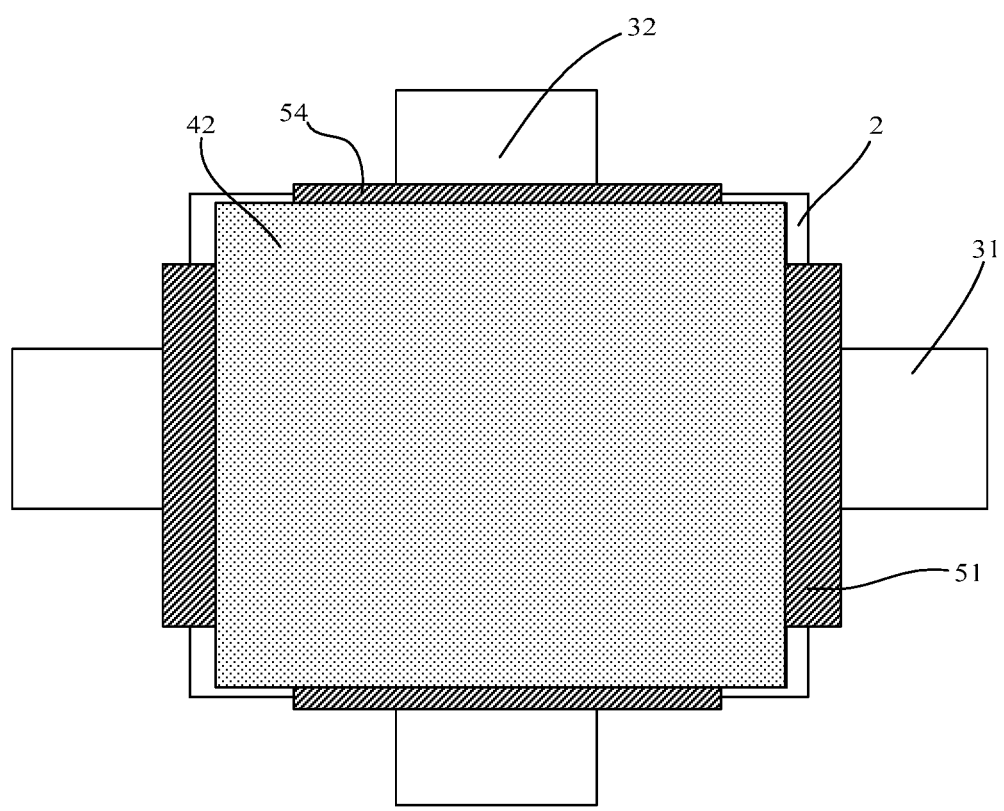
FIG. 12 is a top view of a rigid island having a first moisture-oxygen barrier layer, a first electrode layer, a pixel defining layer, a light-emitting layer, a second electrode layer and a second moisture-oxygen barrier layer in the stretchable display device according to the second embodiment of the present disclosure.

This embodiment is substantially the same in the structure and the forming method of the stretchable display device as the first embodiment, and the main difference is as below. Referring to the top view of the pixel defining layer formed in the pixel encapsulation body of the stretchable display device shown in FIG. 11, after forming the first electrode layer 51, no groove as described above is formed in the pixel defining layer 52 formed on the first electrode layer 51. After forming the pixel defining layer 52, the light-emitting layer 53 and the second electrode layer 54 may be formed sequentially by reference to the first embodiment, which will not be described herein again. Referring to the top view of the second moisture-oxygen barrier layer 42 formed in the pixel encapsulation body of the stretchable display device shown in FIG. 12, after forming the second electrode layer 54, the second moisture-oxygen barrier layer 42 is deposited on a side of the rigid island 2 away from the stretchable substrate 1. The second moisture-oxygen barrier layer 42 is able to cover and exceed the first moisture-oxygen barrier layer 41, thereby forming the sealed space with the first moisture-oxygen barrier layer 41 to seal the light-emitting layer 53 formed in the pixel defining area.

The embodiment of the present disclosure provides another effective encapsulation structure for the pixel encapsulation body, thereby enriching the implementation of the present disclosure.

Third Embodiment

Figure 13:
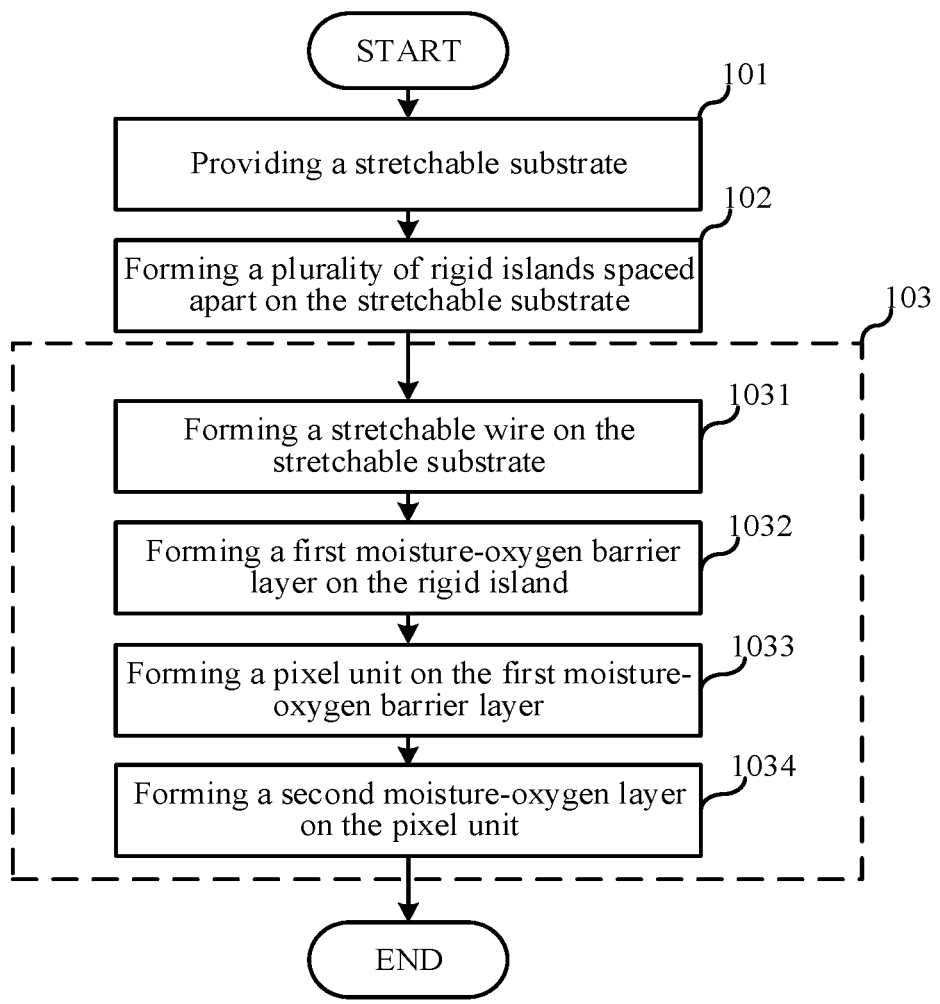
FIG. 13 is a flow chart showing a method for manufacturing a stretchable display device according to a third embodiment of the present disclosure.

The third embodiment of the present disclosure relates to a method for manufacturing a stretchable display device. Referring to FIG. 13, the method in this embodiment includes steps 101 to 103.

At the step 101, a stretchable substrate 1 is provided.

At the step 102, a plurality of rigid islands 2 are formed on the stretchable substrate 1, and the plurality of rigid islands 2 are spaced apart.

At the step 103, a stretchable wire 3 is formed on the stretchable substrate 1, and a pixel encapsulation body is formed on the rigid island. The stretchable wire 3 is connected to the pixel encapsulation body to form a power supply circuit for the pixel encapsulation body.

Continuing to refer to FIG. 1, FIG. 1 shows the cross section of the stretchable display device manufactured by the method according to this embodiment. FIG. 1 shows the cross section of only one rigid island 2 on the stretchable substrate 1 and the pixel encapsulation body on the rigid island 2.

The stretchable substrate 1 provided at the step 101 may be made of an elastic material. Specifically, the stretchable substrate 1 may be made of PDMS with low modulus, elastic polyimide, polyurethane or other elastic materials. The stretchable substrate 1 provided in the step 101 is placed on a rigid supporting plate. The supporting plate may be made of glass, silicon wafer or other rigid materials. After the process of the stretchable display device is completed, the supporting plate is removed in turn to achieve flexibility or stretchability.

The plurality of rigid islands 2 spaced apart on the stretchable substrate 1 at the step 102 may be formed by depositing a rigid layer on the stretchable substrate 1 and patterning the rigid layer. In practical applications, the rigid layer may be made of a material including any one of polyimide PI, silicone rubber with high elastic modulus, and polymethyl methacrylate PMMA (abbreviated as PMMA) or a combination thereof. The silicone rubber with high elastic modulus is, for example, a PDMS having high elastic modulus, and the embodiment does not specifically limit the material of the rigid layer. The processing technology of the above materials is mature or almost mature, which can better ensure the effectiveness and stability of the encapsulation structure of the pixel encapsulation body.

Continuing to refer to FIG. 2, FIG. 2 shows the top view of the plurality of rigid islands 2 spaced apart in the stretchable display device formed at the step 102. Since the elastic modulus of the rigid island 2 is larger than the elastic modulus of the stretchable substrate 1, when the stretchable substrate 1 is stretched, the rigid island 2 is substantially not deformed, so that it can protect the pixel encapsulation body thereon, that is, it is possible to prevent the encapsulation structure of the pixel encapsulation body and the light-emitting pixel (i.e. the pixel unit) in the encapsulation structure from being damaged when the stretchable substrate 1 is stretched.

The step 103 specifically includes a sub-step 1031 to a sub-step 1034.

At the sub-step 1031, a stretchable wire 3 is formed on the stretchable substrate 1.

At the sub-step 1032, a first moisture-oxygen barrier layer 41 is formed on the rigid island 2.

At the sub-step 1033, a pixel unit is formed on the first moisture-oxygen barrier layer 41.

At the sub-step 1034, a second moisture-oxygen layer 42 is formed on the pixel unit.

Continuing to refer to FIG. 1, the sealed space is formed between the first moisture-oxygen barrier layer 41 and the second moisture-oxygen layer 42. At least a portion of the pixel unit extends out of the sealed space, and is connected to the stretchable wire 3.

Continuing to refer to FIG. 3a and FIG. 3b, at the sub-step 1031, the stretchable wire 3 is formed on the stretchable substrate 1, and the stretchable wire 3 is configured to be connected to the pixel encapsulation body to form the power supply circuit for the pixel encapsulation body. Specifically, the stretchable wire 3 is arranged in the interval area between adjacent rigid islands 2 (i.e., the stretchable area on the stretched substrate), and extends onto the rigid island 2. The stretchable wire 3 specifically includes a plurality of row wires 31 arranged on the stretchable substrate 1 in a first direction, and a plurality of column wires 32 arranged on the stretchable substrate in a second direction. The row wire 31 and the column wire 32 are perpendicular to each other, that is, the first direction and the second direction are perpendicular to each other. The row wire 31 and the column wire 32 are both stretchable wires. The row wire 31 is, for example, configured to be connected to the anode or the cathode of the light-emitting pixel encapsulated in the pixel encapsulation body on the rigid island 2, and the column wire 32 is configured to be connected to the cathode or the anode of the light-emitting pixel, so that power is supplied to the light-emitting pixel. In order to reliably connect the stretchable wire 3 to the pixel encapsulation body, at least a portion of the stretchable wire 3 extends onto the rigid island 2. Specifically, at least a portion of the row wires 31 extend onto both left and right ends of the rigid islands 2, and at least a portion of the column wires 32 extend onto both upper and lower ends of the rigid islands 2. Each of the row wires 31 and the column wires 32 is connected to an external control chip, and is powered on or off under the control of the external chip. When the row wire 31 and the column wire 32 connected to the cathode and the anode of the light-emitting pixel in the pixel encapsulation body are powered on, the light-emitting pixel may emit light, otherwise, the light-emitting pixel does not emit light, thereby achieving the separate control of each light-emitting pixel.

In this embodiment, the stretchable wire 3 may be made of a material including any one of a metal material, a carbon nanomaterial, a conductive polymer, and an ion conductor material or a combination thereof. The stretchable wire is, for example, a metal wire, which is for example made of a metal having better conductivity such as gold, silver, copper, aluminum, molybdenum chromium or the like, or made of an alloy metal having conductivity satisfying design requirements. In an example, the stretchable wire may also be made of a metal nanomaterial. For example, the stretchable wire 3 may be processed by using a metal nanowire, nanoparticles, a nanosheet, a nanobelt or the like. The stretchable wire may also be made of a carbon nanomaterial, such as graphene, multilayer graphite, a carbon nanotube, a carbon nanobelt or the like. A liquid metal material may also be used to process the stretchable wire, for example, using a gallium-containing alloy to make the stretchable wire. Alternatively, the stretchable wire may also be processed by using conductive polymer, an ion conductor material or the like. In this embodiment, the processing material of the stretchable wire 3 is not particularly limited, as long as the stretchable wire 3 made of the material can satisfy the stretchability and conductivity requirement. The stretchable wire 3 may be obtained by a patterning process, for example, the stretchable wire 3 may be made by printing, photolithography, laser etching or other patterning processes. The patterning process of the above-mentioned stretchable wire 3 is well known to those skilled in the art, and will not be detailed here. It should be understood that the stretchable wire 3 may maintain conductivity constant or with a minor change in the case of deformation caused by being stretched. Even if the stretchable wire 3 has a certain conductivity change, it may also be compensated by an external circuit, thereby realizing that the displaying brightness of the display device does not change significantly during stretching.

The pixel encapsulation body is formed on the rigid island 2 by the sub-step 1032 to the sub-step 1034 according to the embodiment. At the sub-step 1032, the first moisture-oxygen barrier layer 41 may be obtained by using any of the following processes: CVD, ALD and PVD. The thickness of the first moisture-oxygen barrier layer 41 made by an atomic layer deposition process is very thin. In some examples, the material of the first moisture-oxygen barrier layer 41 may also be a combination of an organic adhesive material with following materials: SiNx and SiOx, that is, the first moisture-oxygen barrier layer 41 is formed by laminating silicon nitride (SiNx) or silicon oxide (SiOx) with the organic adhesive material. Continuing to refer to FIG. 4a and FIG. 4b, the structure of the first moisture-oxygen barrier layer in the stretchable display device, obtained at the sub-step 1032 is shown.

In this embodiment, the pixel unit includes a first electrode layer 51, a pixel defining layer 52 configured to define a position at which the light-emitting layer 53 is formed, a light-emitting layer 53 and a second electrode layer 54. The sub-step 1033 specifically includes: forming the first electrode layer 51 on the first moisture-oxygen barrier layer 41, at least a portion of the first electrode layer 51 extending out of the sealed space, and being connected to the stretchable wire 3 in the first direction on the stretchable substrate 1. Continuing to refer to FIG. 5a and FIG. 5b, the structure of the first electrode layer 51 in the stretchable display device formed at the sub-step 1033 is shown. Next, the pixel defining layer 52 is formed on the first electrode layer 51. The pixel defining layer 52 extends out of the first electrode layer 51 in the second direction until partially overlapping the stretchable wire in the second direction, that is, at least a portion of the pixel defining layer 52 covers the stretchable wire 3 extending onto the rigid island 2 in the second direction. The central area of the pixel defining layer 52 is a pixel defining area. The bottom of the pixel defining area penetrates to the first electrode layer 51 to expose the first electrode layer 51. When or after forming the pixel defining layer 52, the groove 521 surrounding the pixel defining area is formed in the pixel defining layer 52. The bottom of the groove 521 penetrates to the first electrode layer 51 in the second direction, and penetrates to the first moisture-oxygen barrier layer 41 in the first direction. That is, the groove 521 is a through groove penetrating through the pixel defining layer 52. When or after forming the pixel defining layer 52 on the first electrode layer 51, an electrode contact hole 522 may be further formed on the formed pixel defining layer 52. The electrode contact hole 522 is configured to expose the stretchable wire in the second direction. The second electrode layer 54 is connected to the stretchable wire in the second direction through the electrode contact hole 522. Continuing to refer to FIG. 6a and FIG. 6b, the structure of the pixel defining layer 52 in the stretchable display device formed in the sub-step 1033 is shown. Next, the light-emitting layer 53 is formed on the first electrode layer 51 exposed out of the pixel defining area. The formed light-emitting layer 53 is encapsulated in the sealed space. Continuing to refer to FIG. 7a and FIG. 7b, the structure of the stretchable display device with the light-emitting layer 53 formed thereon is shown. Next, the second electrode layer 54 is formed on the light-emitting layer 53 located in the pixel defining area. At least a portion of the second electrode layer 54 extends out of the sealed space, and is connected to the stretchable wire 3 in the second direction on the stretchable substrate 1, that is, the second electrode layer 54 formed in the sub-step 1033 extends to stretchable wire 3 in the second direction, thereby being connected to the stretchable wire in the second direction. Continuing to refer to FIG. 8*a* and FIG. 8*b*, the structure of the stretchable display device with the second electrode layer 54 formed thereon is shown. Next, the second moisture-oxygen layer 42 is formed on the pixel unit, that is, the second moisture-oxygen layer 42 is formed on the second electrode layer 54. The second moisture-oxygen layer 42 is deposited at least on the surface of the groove 521 and the surface of the rigid island 2 surrounded by the groove 521, thereby causing the second moisture-oxygen layer 42 to form the sealed space with the first moisture-oxygen barrier layer 41 through the groove 521. Continuing to refer to FIG. 1 and FIG. 9, the structure of the stretchable display device with the second moisture-oxygen layer 42 formed thereon is shown.

In the embodiment of the present disclosure, the plurality of rigid islands 2 are spaced apart on the stretchable substrate 1, the stretchable wire 3 is arranged on the stretchable substrate 1, that is, the stretchable wire 3 is arranged within the interval area between the adjacent rigid islands 2, and power is supplied to the pixel encapsulation body on each rigid island 2 through the stretchable wire 3, so that the light-emitting pixel is encapsulated on the rigid island 2 separately, and the power is supplied through the stretchable wire 3. The pixel encapsulation body is a separate encapsulation structure of the light-emitting pixel. In this embodiment, the first moisture-oxygen barrier layer 41, the pixel unit and the second moisture-oxygen barrier layer 42 are formed on the rigid island 2 sequentially, and the second moisture-oxygen barrier layer 42 formed subsequently is connected to the first moisture-oxygen barrier layer 41 formed previously through the groove 521 on the pixel defining layer in the pixel unit, thereby forming the sealed space with a good sealing effect, which realizes effective encapsulation for the pixel unit on the rigid island 2. Meanwhile, when the stretchable wire 3 is stretched and deformed with the stretchable substrate 1, the electrical conductivity is substantially unchanged or with a minor change, thereby ensuring that the displaying brightness of the display device under stretching conditions is substantially unchanged, and the rigid island 2 will not be stretched with the stretching of the stretchable substrate 1, thereby ensuring the stability of the pixel encapsulation body.

It is not difficult to find that this embodiment is a method embodiment corresponding to the first embodiment, and this embodiment may be implemented in association with the first embodiment. The related technical details mentioned in the first embodiment are still valid in this embodiment, and in order to reduce redundancy, they are not repeated herein again. Accordingly, the related technical details mentioned in this embodiment may also be applied in the first embodiment.

Fourth Embodiment

The fourth embodiment of the present disclosure relates to a method for manufacturing a stretchable display device. The fourth embodiment is substantially the same as the third embodiment, and the main difference is as below. In the third Embodiment, the stretchable wire 3 is first formed on the stretchable substrate 1, and then the first moisture-oxygen barrier layer 41 is formed on each rigid island 2. However, in the fourth embodiment of the present disclosure, the first moisture-oxygen barrier layer 41 is first formed on each rigid island 2, and then the stretchable wire 3 is formed on the stretchable substrate 1. Since the processing temperature of the first moisture-oxygen barrier layer 41 is higher than the processing temperature of the stretchable wire 3, it may protect the stretchable wire 3 by forming the stretchable wire 3 after forming the first moisture-oxygen barrier layer 41.

Figure 14:
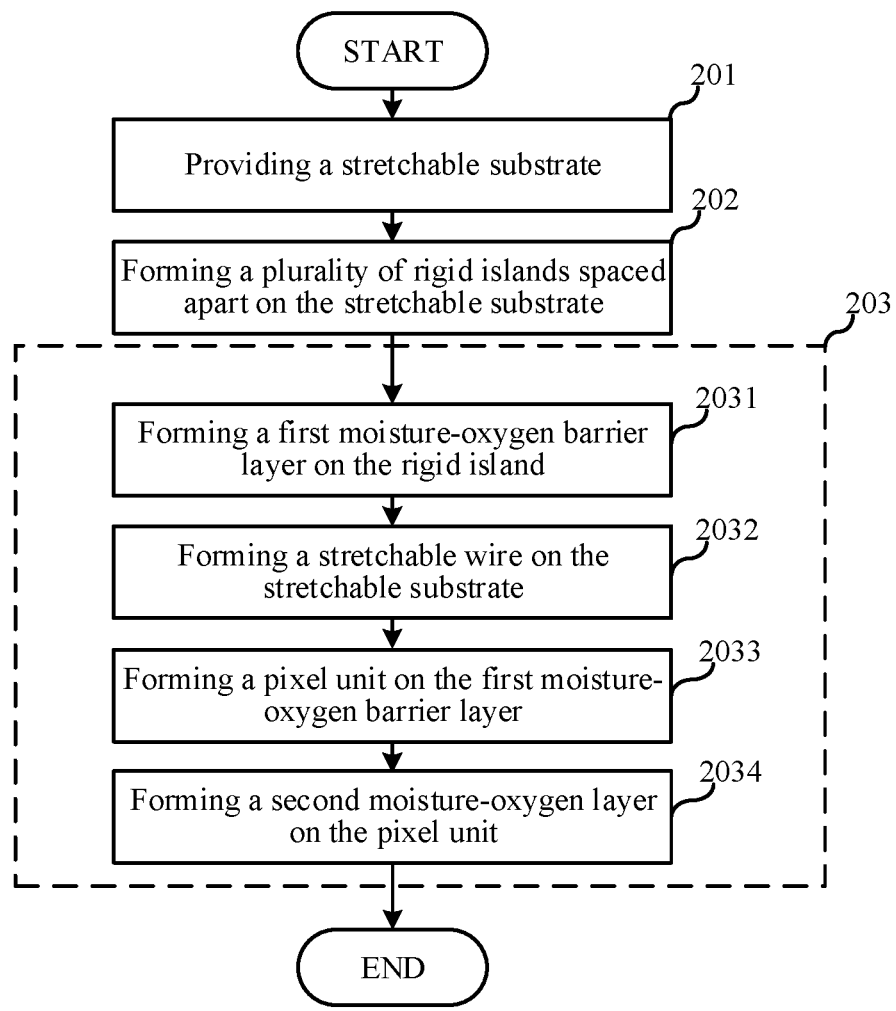
FIG. 14 is a flow chart showing a method for manufacturing a stretchable display device according to a fourth embodiment of the present disclosure.

Referring to FIG. 14, the method for manufacturing the stretchable display device 1 of the embodiment includes steps 201 to 203. The steps 201 and 202 are the same as the steps 101 and 102 in the third embodiment respectively, which will be not described here again. Sub-step 2033 and sub-step 2034 in the step 203 are the same as the sub-step 1033 and the sub-step 1034 in the third embodiment, which will not be described here again.

In this embodiment, at the sub-step 2031 of the step 203, the first moisture-oxygen barrier layer 41 is formed on the rigid island 2. At the sub-step 2032, the stretchable wire 3 is formed on the stretchable substrate 1. The first moisture-oxygen barrier layer 41 is obtained by using a CVD process.

Compared to the third embodiment, in this embodiment, the first moisture-oxygen barrier layer 41 is formed on each rigid island 2 first, and the stretchable wire 3 is formed on the stretchable substrate 1 in turn. Since the first moisture-oxygen barrier layer 41 is obtained by using the CVD process and the processing temperature thereof is higher than that of the stretchable wire, it is possible to avoid the stretchable wire 3 from being subjected to a high temperature, thereby protecting the stretchable wire 3.

It is not difficult to find that this embodiment is an embodiment of a method corresponding to the first embodiment. In addition, this embodiment may also be implemented in association with the second embodiment. The related technical details mentioned in the first or second embodiment are still valid in this embodiment, and in order to reduce redundancy, they are not repeated herein again. Accordingly, the related technical details mentioned in this embodiment may also be applied in the first or second embodiment.

The division of steps in the various methods above is merely for clear description. During implementation, the steps may be combined into one step, or some steps may be divided into a plurality of steps, which all fall within the protection scope of this disclosure provided that a same logic relationship is included. It falls within the protection scope of this disclosure to add insignificant modifications or introduce insignificant designs to the algorithms or processes without changing the core designs of the algorithms and processes of this disclosure.

Fifth Embodiment

The fifth embodiment of the present disclosure relates to an electronic device including the stretchable display device as described in the first or second Embodiment. The electronic device is an electronic device with a display device, such as a smart TV, a tablet computer, a smart phone or the like. The type of the electronic device will not be specifically limited in this embodiment.

In the embodiment of the present disclosure, the plurality of rigid islands 2 are spaced apart on the stretchable substrate 1, the stretchable wire 3 is arranged on the stretchable substrate 1, that is, the stretchable wire 3 is arranged within the interval area between the adjacent rigid islands 2, and power is supplied to the pixel encapsulation body on each rigid island 2 through the stretchable wire 3, so that the light-emitting pixel is encapsulated on the rigid island 2 separately, and power is supplied through the stretchable wire 3. In such a way, the interval area between the adjacent rigid islands 2 on the stretchable substrate 1 becomes a stretchable area, and the stretchable wire 3 is formed on the stretchable area. Therefore, when the stretchable substrate 1 is stretched by an external force, the stretchable area is deformable, thereby causing the display device to have stretchability. In addition, the stretchable wire 3 is stretchable with the stretchable substrate 1 and provides a reliable electrical connection condition (i.e., a reliable power supply circuit) for the pixel encapsulation body on the rigid island 2. Meanwhile, since the pixel encapsulation body on the rigid island 2 is separately encapsulated, and the rigid island 2 is not stretched as the stretching of the stretchable substrate 1, the pixel encapsulation body on the rigid island 2 will not be affected by the external force under the stretching condition, thereby maintaining the stability of its structure and the effectiveness of the encapsulation. Therefore, the display device of the electronic device in this embodiment not only has better stretchability, but also has an effective and stable encapsulation structure under stretching conditions, thereby meeting the stretching needs on the display device of the electronic device in future.

Those skilled in the art may understand that the various embodiments above are specific embodiments for implementing the present disclosure. In practical applications, various changes may be made to the embodiments in forms and details without departing from the spirit and scope of the present disclosure.

The invention claimed is:

1. A stretchable display device comprising:
a stretchable substrate;
a stretchable wire; and
a plurality of rigid islands comprising a rigid island; wherein:
the stretchable wire and the plurality of rigid islands are arranged on the stretchable substrate;
the plurality of rigid islands are spaced apart from one another on the stretchable substrate;
a pixel encapsulation body is separately encapsulated on the rigid island, the pixel encapsulation body is configured as a multilayer structure to form a sealed space for encapsulation; and
the stretchable wire is connected to the pixel encapsulation body to form a power supply circuit for the pixel encapsulation body.

2. The stretchable display device of claim 1, wherein:
the pixel encapsulation body comprises a first moisture-oxygen barrier layer, a pixel unit and a second moisture-oxygen layer;
the first moisture-oxygen barrier layer, the pixel unit, and the second moisture-oxygen layer are formed on the rigid island sequentially; and
a sealed space is formed between the first moisture-oxygen barrier layer and the second moisture-oxygen layer, and at least a portion of the pixel unit extends out of the sealed space, and is connected to the stretchable wire.

3. The stretchable display device of claim 2, wherein:
the pixel unit comprises a first electrode layer, a light-emitting layer and a second electrode layer;
the first electrode layer is located above the first moisture-oxygen barrier layer, and at least a portion of the first electrode layer extends out of the sealed space and is connected to the stretchable wire in a first direction on the stretchable substrate;
the light-emitting layer is located between the first electrode layer and the second electrode layer, and the light-emitting layer is encapsulated in the sealed space; and
the second electrode layer is located under the second moisture-oxygen barrier layer, and at least a portion of the second electrode layer extends out of the sealed space and is connected to the stretchable wire in a second direction on the stretchable substrate, wherein the first direction is perpendicular to the second direction.

4. The stretchable display device of claim 3, wherein:
the pixel encapsulation body further comprises a pixel defining layer defining a position at which the light-emitting layer is formed;
the pixel defining layer is formed on the first electrode layer, and extends out of the first electrode layer in the second direction, until partially overlapping with the stretchable wire in the second direction;
a central area of the pixel defining layer is a pixel defining area, a bottom of the pixel defining area penetrates to the first electrode layer to expose the first electrode layer, and the light-emitting layer is formed on a portion of the first electrode layer exposed out of the pixel defining area; and
the second electrode layer is formed on the light-emitting layer, and extends to the stretchable wire in the second direction.

5. The stretchable display device of claim 4, wherein a groove surrounding the pixel defining area is formed in the pixel defining layer, and a bottom of the groove penetrates to the first electrode layer in the second direction and penetrates to the first moisture-oxygen barrier layer in the first direction.

6. The stretchable display device of claim 4, wherein:
an electrode contact hole is formed in the pixel defining layer,
the electrode contact hole is configured to expose the stretchable wire in the second direction, and
the second electrode layer is connected to the stretchable wire in the second direction through the electrode contact hole.

7. The stretchable display device of claim 1, wherein:
a patterned rigid layer is deposited on the stretchable substrate, and the patterned rigid layer forms the plurality of rigid islands; and
an elastic modulus of the rigid layer is larger than an elastic modulus of the stretchable substrate.

8. The stretchable display device of claim 7, wherein the rigid layer comprises one of polyimide, silicone rubber with high elastic modulus, and polymethyl methacrylate or a combination thereof.

9. The stretchable display device of claim 1, wherein the stretchable wire comprises one of a metal material, a carbon nanomaterial, conductive polymer, and an ion conductor material or a combination thereof.

10. An electronic device, comprising the stretchable display device of claim 1.

11. A stretchable display device, comprising:
a stretchable substrate;
a patterned rigid layer deposited on the stretchable substrate, an elastic modulus of the rigid layer being larger than an elastic modulus of the stretchable substrate;
a stretchable wire; and a plurality of rigid islands formed on the patterned rigid layer;

wherein:

the stretchable wire and the plurality of rigid islands are arranged on the stretchable substrate; and the plurality of rigid islands is spaced apart from one another on the stretchable substrate.

* * * * *